United States Patent
Vane (10) Patent No.: US 8,507,879 B2
(45) Date of Patent: Aug. 13, 2013

(54) OXIDATIVE CLEANING METHOD AND APPARATUS FOR ELECTRON MICROSCOPES USING UV EXCITATION IN AN OXYGEN RADICAL SOURCE

(75) Inventor: Ronald A. Vane, Redwood City, CA (US)

(73) Assignee: XEI Scientific, Inc., Redwood City, CA (US)

( * ) Notice: Subject to any disclaimer, the term of this patent is extended or adjusted under 35 U.S.C. 154(b) by 0 days.

(21) Appl. No.: 13/273,882

(22) Filed: Oct. 14, 2011

(65) Prior Publication Data

US 2012/0260936 A1    Oct. 18, 2012

Related U.S. Application Data

(63) Continuation-in-part of application No. 11/449,475, filed on Jun. 8, 2006, now abandoned.

(51) Int. Cl.
*G21G 1/12* (2006.01)

(52) U.S. Cl.
USPC .................. 250/492.1; 250/493.1; 250/504 R (58) Field of Classification Search
None
See application file for complete search history.

(56) References Cited

U.S. PATENT DOCUMENTS

| | | | |
|---|---|---|---|
| 3,418,465 A | 12/1968 | Hahn et al. | |
| 4,665,315 A * | 5/1987 | Bacchetti et al. | 250/492.1 |
| 4,882,299 A * | 11/1989 | Freeman et al. | 438/488 |
| 5,007,983 A * | 4/1991 | Lerner et al. | 438/725 |
| 5,087,815 A * | 2/1992 | Schultz et al. | 850/63 |
| 5,508,528 A * | 4/1996 | Mulkens et al. | 250/492.1 |
| 5,510,624 A | 4/1996 | Zaluzec | |
| 5,976,328 A * | 11/1999 | Azuma et al. | 204/192.34 |
| 6,426,144 B1 * | 7/2002 | Grunwald et al. | 428/412 |
| 6,465,374 B1 * | 10/2002 | Butterbaugh et al. | 438/795 |
| 6,503,447 B1 * | 1/2003 | Mondjian et al. | 422/4 |
| 6,517,776 B1 * | 2/2003 | Rodgers et al. | 422/24 |
| 6,646,278 B1 * | 11/2003 | Schwarz et al. | 250/504 R |
| 6,667,475 B1 * | 12/2003 | Parran et al. | 850/9 |
| 6,724,460 B2 * | 4/2004 | Van Schaik et al. | 355/30 |
| 6,828,569 B2 * | 12/2004 | Van Schaik et al. | 250/492.2 |
| 7,190,512 B2 * | 3/2007 | Sakai et al. | 359/350 |
| 2003/0059535 A1 * | 3/2003 | Luo et al. | 427/255.28 |
| 2003/0059549 A1 * | 3/2003 | Morrow et al. | 427/421 |
| 2003/0082923 A1 * | 5/2003 | Ono | 438/771 |
| 2003/0095240 A1 * | 5/2003 | Van Schaik et al. | 355/30 |
| 2005/0020000 A1 * | 1/2005 | Yudasaka | 438/199 |
| 2005/0104015 A1 * | 5/2005 | Wedowski et al. | 250/504 R |
| 2005/0242379 A1 * | 11/2005 | Sakai et al. | 257/288 |
| 2006/0017043 A1 * | 1/2006 | Wu et al. | 252/372 |
| 2006/0192158 A1 * | 8/2006 | Wedowski et al. | 250/504 R |
| 2006/0196525 A1 * | 9/2006 | Vrtis et al. | 134/1 |

* cited by examiner

*Primary Examiner* — Andrew Smyth
(74) *Attorney, Agent, or Firm* — Mark D. Perdue (57) ABSTRACT

An improved method and apparatus for the production of oxygen radicals that may be used for cleaning portions high vacuum instruments. The apparatus comprises a VUV vacuum ultraviolet light source or lamp placed in an irradiation chamber for the photo disassociation of oxygen in communication with the main chamber on a specimen chamber port or inside the specimen chamber. Air or other oxygen-containing gas is admitted to the irradiation chamber for photo disassociation. The VUV source radiates UV wavelengths below 193 nm that are used to disassociate oxygen in the gas to create the oxygen radicals and the pressure is held high enough for complete absorption of the light. The oxygen radicals are differentially pumped into main chamber at pressure below 100 milliTorr to prevent recombination to clean hydrocarbons from the surfaces instrument by oxidation to volatile oxide gases. The oxide gases are then removed by the vacuum pump.

9 Claims, 4 Drawing Sheets

SEM CLEANING CONTROL

FIG. 1
SCANNING ELECTRON MICROSCOPE
WITH CLEANING DEVICE

FIG. 2  SEM CLEANING CONTROL

Fig. 3

Fig. 4

# OXIDATIVE CLEANING METHOD AND APPARATUS FOR ELECTRON MICROSCOPES USING UV EXCITATION IN AN OXYGEN RADICAL SOURCE

CROSS REFERENCE TO RELATED APPLICATIONS

This application is a continuation-in-part of application Ser. No. 11/449,475 filed Jun. 8, 2006, now abandoned.

BACKGROUND OF THE INVENTION

1. Field of Invention

The present invention relates to cleaning vacuum chambers and vacuum analytical instruments such as Scanning Electron Microscopes (SEM), Scanning Electron Microprobes, Transmission Electron Microscopes (TEM) and other charge particle beam instruments that are subject to contamination problems from hydrocarbons.

2. Description of Prior Art

Electron microscopy is used to detect, measure, and analyze constituents present in very small areas of materials. Hydrocarbon contaminants adsorbed on the surface or surface films interacting with the incident electron probe beam can distort the results. The distortion may take the form of deposits of polymer in the scanned area, a darkening of the scanned area, a loss of resolution, or other artifacts. Deposits created by the interaction of the probe beam with the surface specimen also may interfere with the probe beam or emitted electrons and x-rays and thus adversely affect accurate analysis. Deposits also add uncertainty to SEM measured line widths for semiconductor device critical dimension metrology. These Hydrocarbons are present in trace levels in ordinary room air and come from living organisms and man-made material. All surfaces exposed to room air at atmospheric pressure accumulate these hydrocarbons. In the semiconductor industry said contamination is known as Atmospheric Molecular Contamination or "AMC". Reducing and controlling AMC is an active area of concern for semiconductor manufacturers as device dimensions get smaller. Surfaces are thither hydrocarbon contaminated by touching, the use of high vapor pressure materials in vacuum system, or in general "poor vacuum practices".

Another problem is the condensation of pump oils on the windows of the x-ray and electron detectors distorting results. The most serious problem of this type is the absorption of low-energy x-rays from Be, C, N, O and F by oil films which can prevent measurement of these elements by X-ray emission spectroscopy.

Contaminants typically are introduced by one of four ways including on the specimen, on the specimen stage, carried into the chamber by the evacuation system, or are present on the internal components of the instrument. Contaminants introduced from the evacuation system can be reduced by trapping, by purging, or by using cleaner pumps. Once present inside the chamber, these contaminants reside on the chamber surfaces and can be removed only slowly and with low efficiency by the high vacuum pump.

Inorganic specimens (metals, ceramics, semiconductors, etc.) may carry contaminants into the chamber. These may be part of the specimen, residues from sample preparation techniques or be caused by improper sample handling or storage techniques. In addition, clean surfaces will accumulate a surface film of hydrocarbon scum if left exposed to ordinary room air for any length of time. The sources of these hydrocarbons are most any living thing, organic object, or other source of hydrocarbon vapors in the vicinity. While the part of the films created in these processes dissipate under vacuum conditions, a small amount generally remains on surfaces and is sufficient to cause problems when the specimen is subsequently examined in the analytical instruments listed.

These residues are widely distributed and generally are at low concentrations on the various surfaces. Some of the contaminant molecules become mobile in the vacuum environment. At high vacuum the mean free path of molecules once vaporized is comparable to or longer than the dimensions of the vacuum chamber of these instruments. The contaminants move in the vapor phase from surface to surface in the vacuum environment and are attracted to any focused electron probe beam, forming deposits through an ionization and deposition process. These deposits are also degraded into black carbon deposits by vacuum ultraviolet VUV light and intense laser light sources. Since these contaminants can travel large distances within the vacuum chamber and over the surface of a specimen, it is important to remove or immobilize these species as much as possible prior to an analysis without disturbing the microstructure of the specimen.

Several patents have previously described methods of reducing contamination in electron microscopes. Hahn et al in U.S. Pat. No. 3,148,465 (1968) described a method of immobilizing the Hydrocarbon by exposing it to radiation near the specimen to produce an adsorbing effect on the surrounding surfaces. A device for cleaning electron microscope stages and specimens is described in U.S. Pat. No. 5,510,624 (Zaluzec, 1995) for analytical electron microscopes. That apparatus uses a plasma generating chamber and an airlock to allow the specimen and stageS to be placed into the plasma chamber for cleaning. It may be connected with the analytical chamber of the analytical electron microscope. Glow-discharge and plasma cleaning devices and cleaning methods for electron optics are described in U.S. Pat. Nos. 5,312,519 (Sakai et al.), 5,539,211 (Ohtoshi et al.) and 4,665,315 (Bacchetti et al.). These three patents use either direct or remote plasma cleaning to clean the electron optics of the instruments.

Vane disclosed in U.S. Pat. Nos. 6,105,589, 6,452,315, and 6,610,257 the technology used by XEI Scientific, Inc. in the Evactron® De-Contaminator systems that have been sold for cleaning electron microscopes and other vacuum systems since 1999. These patents describe an oxidative cleaning system and apparatus using low powered RF plasma to produce oxygen radicals, an active neutral species, from air to oxidize and remove these hydrocarbons. This plasma excited system works well, but suffers from a Nitrogen ion problem as disclosed in the first patent (U.S. Pat. No. 6,105,589) and solved by using a very low energy plasma and special electrode (U.S. Pat. No. 6,610,257) for dissociation of the oxygen in air. The reaction with oxygen radicals to produce CO, CO2, H2O and other volatile oxides such as short chain alcohols and ketones are the most important for the cleaning and removal of hydrocarbons by the vacuum pump. These reaction products are quickly removed as gases from the vacuum system. The ions and electrons produced by the plasma are not needed as the reactive species for hydrocarbon removal. A disadvantage of plasma is that they produce UV light, ions, and electrons that polymerize the hydrocarbons and make them harder to remove. In the absence of nitrogen ions or other reactive species that destroy O radicals, O radicals are long lived and have the ability to do isotropic cleaning on all surfaces in the chamber. Another disadvantage of the Evactron device is that it will not produce O radicals at pressures below 10-4 Torr which keeps the Evactron from cleaning when the instrument is at high vacuum. Another disadvantage is that the plasma produces high levels of free electrons in SEM imaging while the Evactron plasma is operating. (® XEI Scientific, Inc.)

In the operation of the Evactron® systems it was noticed that the UV light from plasma source had a positive effect on the cleaning efficiency of system, thus further investigation was done. It has been well documented that UV light can be used to produce Ozone and then disassociate Ozone to make O radicals for removing semiconductor photo resist and other accumulated reaction products in semiconductor production. (Rhieu U.S. Pat. No. 6,143,477), (Parke U.S. Pat. No. 6,098,637). The usual method is to produce Ozone either by disassociation of Oxygen by electrical discharge, in a plasma, or by UV excitation with wavelengths below 193 nm. The O radicals (O1 atoms) then react with O2 to form O3 Ozone. The production of Ozone is an exothermic chemical reaction and energy is released. It is well known in chemical physics theory that this reaction requires a third body, another molecule or atom, to carry away this extra energy as kinetic energy, or the newly formed ozone molecule will promptly disassociate. As practical matter this means that Ozone is not formed in significant quantities at pressures below about 133 Pa (Pascal) or 1 Torr. Thus to form Oxygen radicals for use in a vacuum system all that is required are pressures below 1 Torr, O2, and source of energy for disassociation. The Evactron De-Contaminator uses an RF plasma to produce Oxygen radicals. But UV light can also be used to make Oxygen radicals. UV light from 193 nm to 150 nm is strongly absorbed by Oxygen O2 to produce O radicals. UV light between 220 nm and 240 nm weakly photo disassociates Oxygen.

The use of UV light to excite Oxygen for cleaning and ashing has been done by others. Spill (U.S. Pat. No. 7,005,638) discloses directing an electron beam and UV light beam simultaneous on the specimen surface to reduce contamination. Van Schaik et al (U.S. Pat. No. 6,724,460) uses the interaction of the EUV beam with low concentration of oxygen to produce oxygen radical for cleaning a lithographic projection apparatus. Agarwal (U.S. Pat. No. 6,649,545) discloses using UV lamps to keep active species produced in a upstream plasma active for plasma processing. Rheiu (U.S. Pat. No. 6,143,477) discloses the use of two UV lamps to make Oxygen radicals for cleaning/ashing of semiconductor wafers. The first is used to make Ozone with UV<190 nm and the second (about 250 nm) to disassociate the Ozone to make radicals.

It is an object of the present invention to provide an improved method for cleaning the specimen chamber, specimen stage and a specimen in the vacuum system of an electron microscope or similar analytical instrument using an electron beam such as a scanning electron microprobe instrument or Focused ion beam instrument. It is another object of the present invention to produce more O radicals from air by completely avoiding the production of nitrogen ions. It is another object of the present invention to use single UV lamp and to avoid the production of ozone by using vacuum pressures too low to sustain ozone formation. It is another object of the present invention to produce oxidation and ashing without the need to expose the surfaces or chamber to high intensity UV light or plasma. It is another object of the present invention to provide a method for cleaning said instruments that can be operated at lower pressures than plasma methods thus alleviating the need to raise to pressure to plasma operation pressures, and allow instrument operation during cleaning. It is another object of the present invention to provide a method for cleaning said instruments that does not produce free electrons and ions in a plasma that would interfere with electron detection during instrument operation. It is another object of the present invention to provide a cleaning system that is small and that can be mounted on a standard chamber port of the electron microscope without mechanical interference from other devices and parts of the electron microscope. These improvements results in a cleaning system that is faster and cleans the specimen chamber, stage, and specimen of the analytical instrument better than previous arrangements. The result of a cleaner specimen, specimen chamber and stage is that the deposition of hydrocarbon polymer on the scanned area is reduced or eliminated resulting in better measurements. Another result of cleaner specimen chambers is that the condensation and adsorption of hydrocarbons on detector windows is reduced which allows the passage of more low energy x-rays and electrons through these windows.

SUMMARY OF THE INVENTION

It is a general object of the present invention to provide an improved method for cleaning the specimen chamber, specimen stage, and a specimen in the vacuum system of an electron microscope or similar analytical instrument using an electron beam such as a scanning electron microprobe instrument or focused ion beam instrument. It is also useful for providing oxygen radicals in any high vacuum chamber for cleaning, carbon removal, or other purposes in local areas of the chamber.

It is another general object of the present invention to produce more oxygen radicals from air by completely avoiding the production of nitrogen ions. It is another object of the present invention to use a single VUV (Vacuum Ultra Violet) lamp and to avoid the production of ozone by using vacuum pressures too low to sustain ozone formation.

It is still another general object of the present invention to produce oxidation and ashing without the need to expose the surfaces or chamber to high intensity VUV light or plasma.

It is yet another general object of the present invention to provide a method for cleaning such instruments that can be operated at lower pressures than plasma methods, thus alleviating the need to raise the pressure for plasma operation, and allow instrument operation during cleaning.

It is another object of the invention to produce oxygen radicals at a one pressure in vacuum irradiation chamber such that all of the VUV photons are fully absorbed for photo disassociation and then move the radicals and gas by differential pumping in to a lower pressure vacuum chamber where the Oxygen radical residence time is longer because pressure is low enough to minimize recombination of the radicals.

It is another object of the present invention to provide a method for cleaning such instruments that does not produce free electrons and ions in a plasma that would interfere with electron detection during instrument operation.

It is a further general object of the present invention to provide a cleaning device that is small and that can be mounted on a standard chamber port of the electron microscope without mechanical interference from other devices and parts of the electron microscope. The device could also be small enough to be mounted completely inside the main vacuum chamber.

These and other objects of the present invention are achieved with an improved method and apparatus for oxidative cleaning the specimen chamber, the specimen, and the specimen stage of electron microscopes and other charged beam instruments and high vacuum systems. The invention generally comprises a UV light lamp with Vacuum UV wavelengths below 193 nm, that disassociates oxygen, with an oxygen containing gas flowing past the VUV lamp to form an oxygen radical source that may be mounted on a port of the specimen chamber of the electron microscope or other vacuum chamber. The oxygen radicals flow from the source through the chamber at lower pressure by differential pumping to the pumps and remove hydrocarbons by oxidation. The lower pressure of the chamber also allows the oxygen radicals to have longer residence times and avoid recombination before oxidizing carbon compounds or other species.

The invention further comprises the operation and design of the UV-activated oxygen radical source in such a way that it generates oxygen radicals from air and other nitrogen/oxygen mixtures without the production of ions and free electrons. The oxygen radicals are used for cleaning the interior walls and surfaces of the specimen chamber, the specimen stage, and the specimen.

The invention further comprises a control method and arrangement for operating the evacuation system of the electron microscope, the UV source, and the admission of gas into the chamber.

These improvements result in a cleaning system that is faster and cleans the specimen chamber, stage, and specimen of the analytical instrument or other vacuum chambers better than previous arrangements. The result of a cleaner specimen, specimen chamber and stage is that the deposition of hydrocarbon polymer on the scanned area is reduced or eliminated, resulting in better measurements. Another result of cleaner specimen chambers is that the condensation and adsorption of hydrocarbons on detector windows is reduced, which allows the passage of more low energy x-rays and electrons through these windows. Another result is that carbon is removed from the vacuum system.

BRIEF DESCRIPTION OF DRAWINGS

The present invention together with the above and other objects and advantages may best be understood from the following detailed description of the preferred embodiments of the invention illustrated in the drawing, wherein.

| REFERENCE NUMERALS IN DRAWINGS | |
|---|---|
| 1 | Electron Gun |
| 2 | Electron Column |
| 4 | Vacuum Chamber |
| 6 | Specimen |
| 8 | Specimen Stage |
| 10 | X-ray Spectrometer |
| 12 | X-ray Detector and Window |
| 14 | Secondary Electron Detector |
| 16 | Final Aperture |
| 18 | Electron Beam |
| 20 | High Vacuum Pump |
| 22 | Roughing Pump |
| 24 | Foreline Pump |
| 26 | SEM Vacuum-Sequence Controller |
| 30 | High Vacuum Valve |

| REFERENCE NUMERALS IN DRAWINGS | |
|---|---|
| 32 | Roughing Valve |
| 34 | Foreline Valve |
| 36 | Vent Valve |
| 38 | Vent Gas supply |
| 42 | Oxidative Gas Supply |
| 44 | Oxidative Gas Control Valve |
| 46 | Vacuum Gauge |
| 50 | Irradiation Chamber |
| 51 | UV lamp |
| 52 | Insulated-Vacuum Feedthrough |
| 54 | Power cable |
| 56 | UV Lamp Power Supply |
| 60 | Controller - UV Oxidative Cleaning |

DETAILED DESCRIPTION OF THE INVENTION

In accordance with the invention, a technique has been developed which allows simultaneous cleaning of the interior, a specimen, and a specimen stage of a scanning electron microscope that minimizes, and in some cases eliminates, hydrocarbon contamination and films from the surface of inorganic specimens during analysis by Scanning Electron Microscopes.

The invention also has utility for other analytical instruments such as Transmission Electron Microscopes, Scanning Electron Microprobes, Focused Ion Beam and other charged-particle-beam instruments that have a vacuum environment and provide analytical information from emitted electrons and x-rays from the specimen. The specimen need not be present during chamber and stage cleaning.

It also has utility for cleaning high vacuum chambers of any type where hydrocarbon or carbon removal is desired.

The cleaning procedure for electron microscopes, which involves subjecting the vacuum chamber 4, specimen 6, and stage 8 to oxygen radicals for oxidation and removal of hydrocarbons, is carried out prior to analysis using the instrument. The oxygen radicals are generated in a irradiation chamber 50 by passing low-pressure air, or an oxygen-containing gas 44 such as a nitrogen and oxygen mixture, through or by the radiation from a VUV (vacuum ultraviolet) lamp 51 that produces wavelengths below 193 nm. The typical rate of flow of gas is at least 10 SCCM and less than 200 SCCM (standard cubic centimeters per minute) through the irradiation chamber resulting in a typical pressure of less than 1 Torr in the irradiation Chamber 50 and less than 100 mTorr in the main chamber 4 when pumped with a high speed pump 20 such as a turbo pump. An orifice may be used between the differentially pumped chambers. The VUV lamp 51 is mounted inside an irradiation chamber 50 that is mounted on a port on a vacuum chamber 4 such as the specimen chamber of the electron microscope or other high vacuum system. The main chamber 4 of the instrument will have a lower pressure than the irradiation chamber 50 and the oxygen radicals will flow by differential pumping into the main chamber 4. In the main chamber, it is desirable that the pressure to be less than 100 mTorr to reduce the collision rate of the oxygen radicals and to extend their life times and mean free paths, see FIG. 3.

The VUV source 51 is in the irradiation chamber 50. The pressure of the irradiation chamber 50 is selected such that the VUV light below 193 nm is fully absorbed by the oxygen in the gas and used to disassociate the oxygen into radicals, and kept below pressures, typically>1 Torr, where Ozone is formed. Air or other oxygen-containing gas is supplied through a control valve 44 to maintain the selected pressure while the chamber is being vacuum pumped. The pressure is chosen such that all of the VUV light below 193 nm is absorbed by the oxygen and used to disassociate the oxygen molecules. The gas flows past the VUV lamp 51 (and through its radiation), differentially pumped into the vacuum chamber 4 and on to the vacuum pumps 32 and, carrying the oxygen radicals into the chamber to destroy hydrocarbons and removed as the oxidized gases.

The advantage of dual vacuum chamber arrangement is that the gas is carried past or through the most intense VUV light by the lamp to disassociate, and then active species of radicals produced then are carried at almost full strength to the surfaces to be cleaned at higher vacuum with higher residence time. This is preferable to the arrangement where UV light is projected on the surface to be cleaned and reactive gas is supplied at the spot to be cleaned because the intensity of the UV light is diminished by the cube of the distance from the source.

DETAILED DESCRIPTION OF THE PREFERRED EMBODIMENTS

Figure 1:
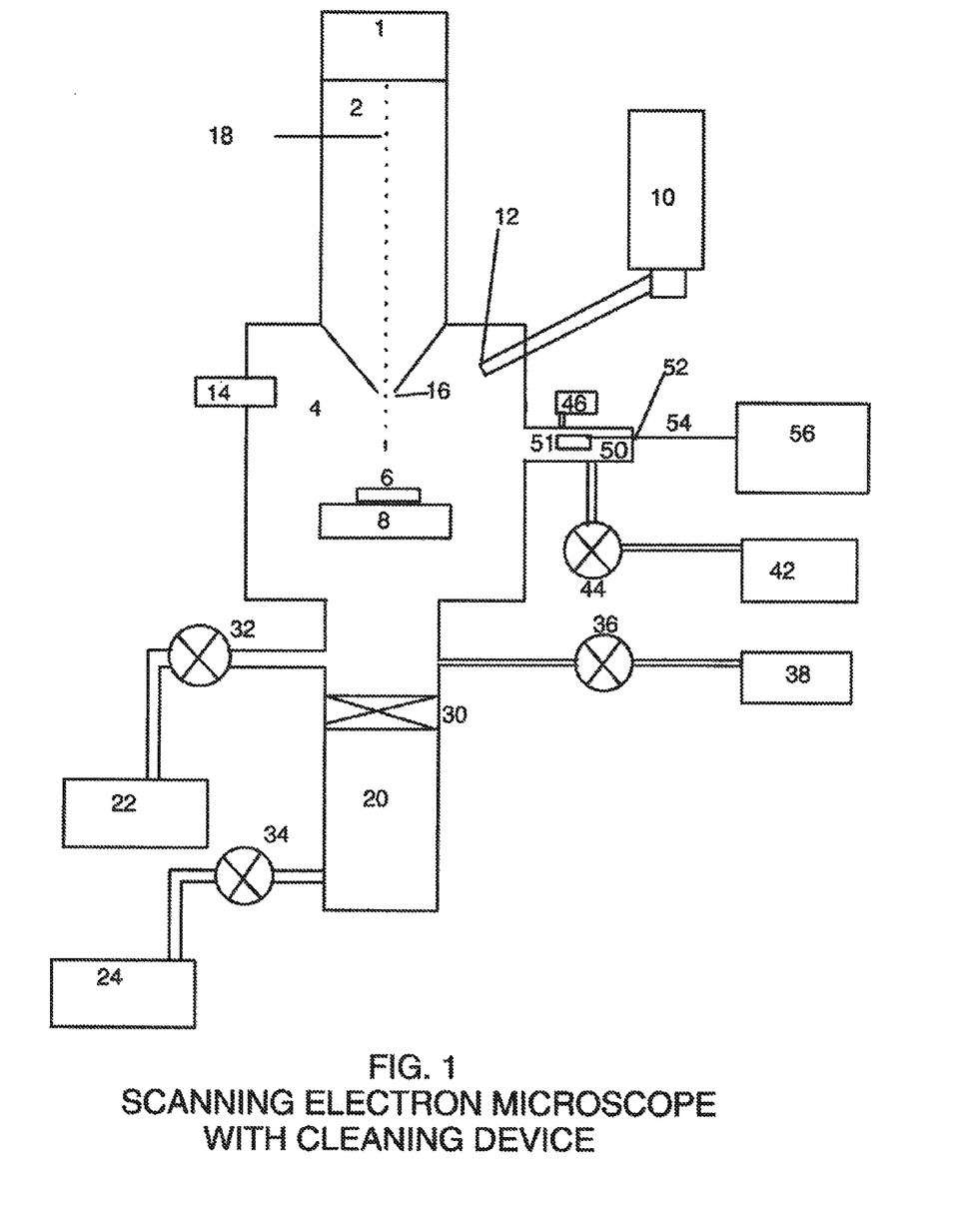
FIG. 1 is a diagram of a typical scanning electron microscope (SEM) and accessories with an apparatus to implement the present invention installed.

FIG. 1 is a schematic of a typical Scanning Electron Microscope (SEM) with the external UV cleaning device installed that employs the present method. An electron gun 1 generates an electron beam 18, which is focused and scanned within electron column 2. Beam 18 exits through aperture 16 into specimen chamber 4 and scans across specimen 6. The specimen 6 is mounted on stage 8. The stage 8 can be manipulated to mechanically locate the specimen 6 under the beam 18. The specimen 6 emits electrons and x-rays when scanned, and a variety of detectors may be used to obtain analytical information. In the usual case, the most important of these are secondary electron detector 14 and Energy Dispersive (EDS) x-ray detector with an x-ray spectrometer 10. The x-ray detector is separated from the specimen chamber 4 by a x-ray window 12.

Electron scanning for microscopy is done under vacuum conditions. Typically, the specimen or vacuum chamber 4 is connected to high vacuum pump 20 thorough a valve 30. A foreline pump 24 is used to pump the exhaust of the high vacuum pump 20. A valve 34 separates the high vacuum pump 20 and foreline pump 24.

Pre-evacuation or "roughing" the chamber 4 is done by means of a roughing pump 22 that connects to the chamber 4 by way of roughing valve 32. In evacuation of the chamber 4, a low partial or rough vacuum must be obtained first before the high vacuum pump 20 can function. In some arrangements of SEMs, the functions of the foreline pump 24 and the roughing pump 22 are combined through means of a valving system so that only one low vacuum pump is needed for both functions. Venting of the chamber 4 takes place through a vent valve 36 using vent gas supply 38 or air. All modern SEM models provide an automatic valve sequencing controller 26 (shown in FIG. 2) to simplify evacuation of the microscope for the user. For most models, the user interface consists of a VENT and EVAC or similar push-button control provided as real buttons or on a touch-sensitive computer screen.

The first embodiment of the present invention method uses an irradiation chamber 50 with an interior vacuum ultraviolet (VUV) lamp 51. Chamber 50 is separated from but communicates with specimen chamber 4. Alternatively, chamber 50 can be contained entirely within specimen chamber 4. The VUV lamp 51 is connected to a power supply 56 through cable 54, which extends through an insulated vacuum feedthrough 52 to the exterior of the vacuum chamber and is connected to the VUV lamp 51.

The output of VUV lamp power supply 56 controls the power and the temperature of the VUV lamp 51. At the preferred operating VUV wavelengths and pressures of the present method, oxygen radicals are produced that flow into the specimen chamber 4 by differential pumping. The preferred VUV wavelengths are between 193 nm and 150 nm. According to the preferred embodiment of the present invention, these wavelengths of the VUV source are selected so that nitrogen is not disassociated or ionized, and irradiation chamber 50 pressure is limited to below 133 Pa or 1 Torr so that the oxygen radicals do not react with air molecules to form ozone ($O_3$) or nitrous oxide ($N_2O$) molecules by means of three-body collisions in significant quantities.

According to one embodiment of the present invention, a mercury (Hg) vapor lamp is employed as the VUV light source 51. Preferably, the mercury vapor lamp is a resonance lamp that emits light at 185 nm. That wavelength will disassociate oxygen with 100% of the light at 185 nm producing oxygen radicals. Mercury vapor lamps produce most of their output at 254 nm, but with some radiation at 185 nm. This VUV light is not absorbed by nitrogen molecules.

According to another embodiment of the present invention, a xenon (Xe) excimer lamp is employed as the VUV lamp 51. The xenon excimer lamp produces radiation that peaks at 172 nm, which disassociates oxygen into oxygen radicals at high efficiency, but is not absorbed by nitrogen molecules.

In the preferred embodiment of the present invention shown in FIG. 1, the oxygen-containing reactive gas is fed through VUV irradiation chamber 50. A reactive gas supply 42 supplies the reactive oxygen gas mixture gas for disassociation. According to the preferred embodiment of the present invention this reactive gas is air. The reactive gas may be pure oxygen or any gas mixture containing molecular oxygen or oxygen compounds. Nitrogen/oxygen gas mixtures that contain 15%-30% oxygen are good choices for preferential removal of hydrocarbon films. A high percentage (>50%) oxygen mixture is avoided because of the explosion hazard in the vacuum pumps 22 and 24 if they are oil-sealed rather than dry pumps.

Valve 44 controls the reactive gas flow into the glow or radiation discharge of the UV lamp 51 and into chamber 4. According to the preferred embodiment of the present invention, the reactive gas is led directly into the UV chamber 50, and oxygen radicals formed by exposure of the gas to radiation from the UV lamp 51 flow into the chamber 4 by differential pumping.

A pressure gauge 46 is used to monitor the chamber vacuum during cleaning and may be mounted on the irradiation chamber 50 or chamber 4. According to the preferred embodiment of the present invention, the chamber pressure is maintained below 100 mTorr during cleaning to produce longer residence time for the oxygen radicals. The present invention uses the oxygen radicals to oxidize the hydrocarbon contaminants to clean the specimen chamber walls, the specimen, and the specimen stage to form volatile oxide gases such as CO, $CO_2$, and $H_2O$ that are carried to the pumps 16 or 22.

Figure 2:
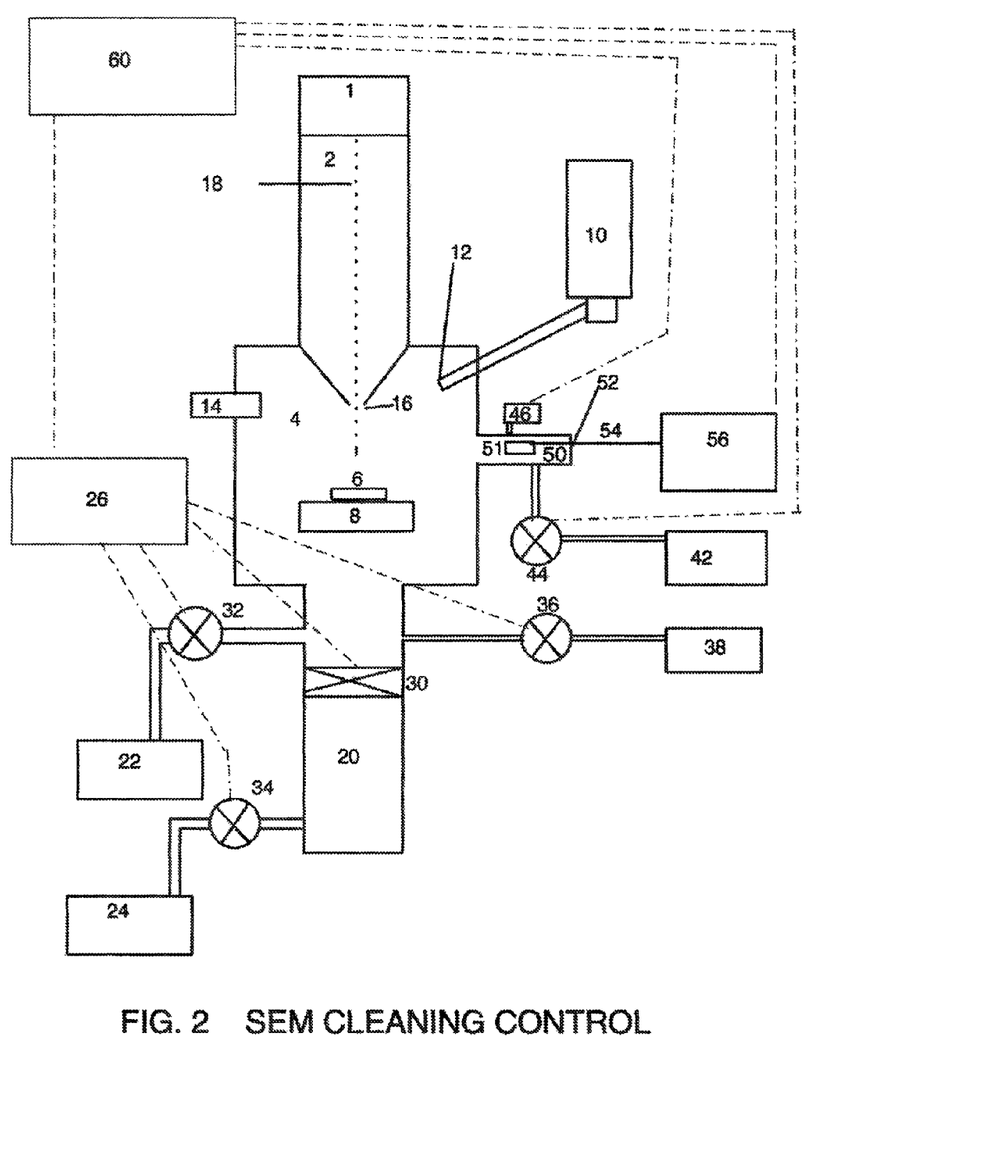
FIG. 2 is a diagram of a control system for the present invention and its interaction with the SEM evacuation control system.

FIG. 2 illustrates a control arrangement for the present invention. A controller 60 may be connected to the SEM vacuum sequence controller 26 to start the vent and evacuation cycles. The controller 60 operates valve 44 to admit air, monitors the vacuum though gauge 46, and operates the power supply 56 in a predetermined and timed sequence. As an alternative control method, the controller 60 has no direct connection to the valve, sequence controller 26 and instead uses the changes in pressure as sensed by vacuum gauge 46 to determine when to start the cleaning sequence. In this alternative, cleaning is initiated by the operator venting the chamber to a pressure above 1 Torr and then restarting the evacuation system. When the pressure drops to a preset level (preferably below 1 Torr) the flow of oxidative gas is started by opening valve 44 and turning on the V UV lamp 51.

Operation

Another embodiment of the method of cleaning according to the present invention employs the following operating sequence to clean the chamber:

Partially vent the chamber 4 using vent gas 38 supplied through vent valve 36.

When the pressure in the specimen chamber 4 is above 1 Torr, restart evacuation of the chamber by operating the roughing and/or high-vacuum pumps 20, 24.

Open valve 44 and admit reactive gas 42 into chamber 50. The reactive gas is air or any gas or mixture containing oxygen.

The VUV source may be operated when the pressure is below 1 Torr. At this or another pre-selected pressure turn on the VUV lamp to produce radiation below 193 nm and above 150 nm wavelength. Oxygen radicals are created by exposure of the reactive gas to the beam or radiation of the UV lamp. These radicals pass from irradiation chamber 50 to chamber 4 thereby cleaning the chambers of hydrocarbon contaminants by oxidation.

At a predetermined time, close valve 44 and let chambers 4, 50 evacuate.

At a predetermined time (after sufficient time has elapsed for cleaning), stop oxygen radical cleaning by turning off the UV source.

A purge gas of dry nitrogen optionally may be admitted though either valve 44 or 36 to sweep away the remaining oxygen and oxidation product gases after the glow discharge is turned off.

The sequence may be repeated, if further cleaning is needed. After cleaning is complete, the SEM (or other instrument) is pumped down to operating pressure.

Figure 3:
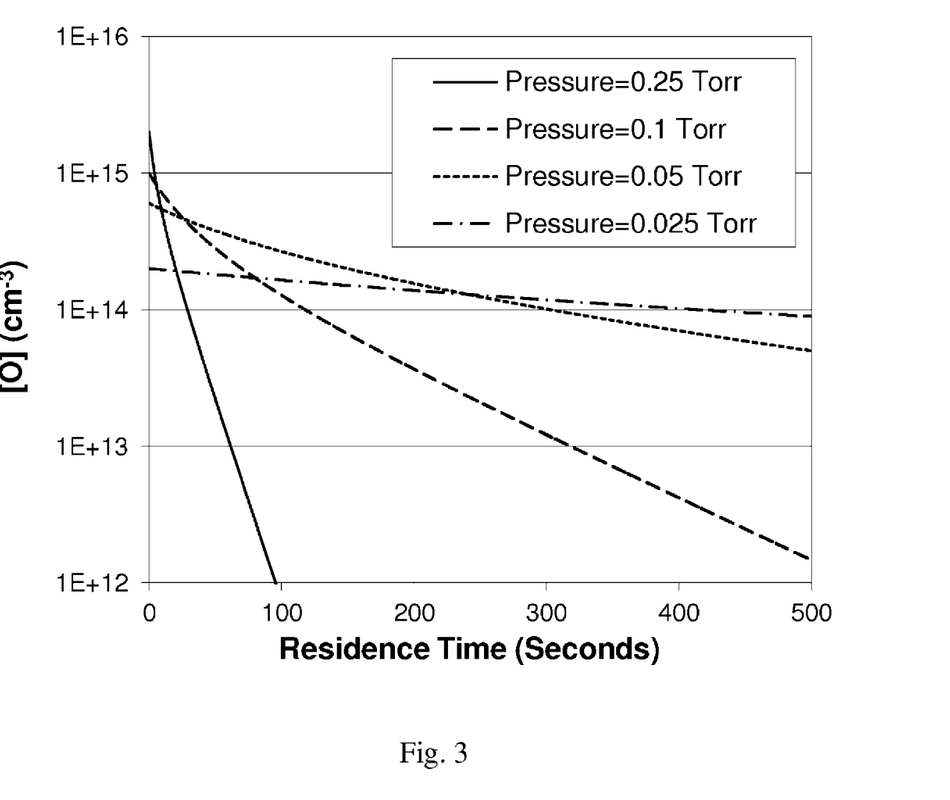
FIG. 3 is a chart showing the change in oxygen radical concentration as a function of residence time in a vacuum chamber.

The effect of pressure on the residence time of oxygen radicals in a vacuum chamber is shown in FIG. 3. The traces in the chart are derived from a chemical kinetics model that uses the following reactions 1) O+O+M→O2+M, 2) O+O2+M→O3+M, 3) O+O3→O2+O2. In these reactions M is any gas molecule in the system, and an increase in pressure will cause and increase in reactions 1) and 2) above. Additionally as the pressure decreases the concentration of oxygen radicals stays fairly constant as a function of residence time which allows the radicals to travel farther from their source. This chart show the clear advantage of having a lower pressure in the main chamber improve the lifetime and concentration of oxygen radicals.

Figure 4:
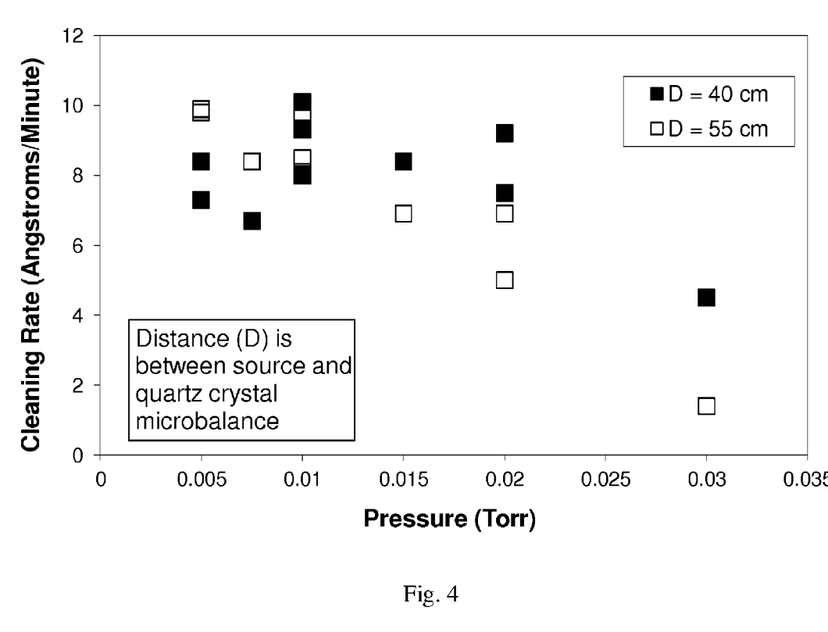
FIG. 4 is a chart with experimental cleaning rates at various chamber pressures and distances from the oxygen radical source.

These behaviors are seen in experimental data reported in FIG. 4. Cleaning rates of hydrocarbon removal are proportional to oxygen radical concentration. Cleaning rates are measured using a quartz crystal microbalance (QCM) contaminated with hydrocarbons by evaporating under low vacuum pump oil onto the QCM surface. For this experiment the oxygen radical source was an RF plasma device in which room air was allowed to flow through the plasma. Two contaminated QCMs were placed a fixed distance from the source. As the pressure is decreased in the vacuum chamber, the cleaning rate at both QCMs increases. More oxygen radicals present at the QCM location causes the cleaning rate to increase. Also, as the pressure decreases, the cleaning rates at the two locations converge, showing that oxygen radical concentration is becoming more uniform in the chamber.

While the present embodiments of the invention are described, it is to be distinctly understood that the invention is not limited thereto but may be otherwise embodied and practiced within the scope of the following claims.

I claim:

1. An oxygen radical source for a vacuum system for removing carbon compounds from a vacuum chamber comprising:
   a vacuum chamber having an interior that is selectively maintained at a selected pressure below 100 milli Torr;
   a separate UV irradiation chamber in fluid communication with the vacuum chamber but at higher pressure;
   a source of oxygen-containing gas in fluid communication with the interior of the irradiation chamber;
   at least one surface contained within the vacuum chamber to be cleaned of hydrocarbon contaminants; and
   an vacuum ultraviolet radiation source in communication with interior of said irradiation chamber, the ultraviolet radiation source emitting radiation at wavelengths less than about 193 nm, wherein oxygen containing gas is exposed to radiation from the ultraviolet radiation source at a pressure at which all of the vacuum ultraviolet radiation at said wavelengths is absorbed and used for dissociation of the oxygen, and the resulting oxygen radicals are differentially pumped into the vacuum chamber with a lower pressure to minimize the recombination of the oxygen radicals before cleaning the surface in the vacuum chamber of hydrocarbon contaminants by oxidizing the contaminants, wherein the intensity of the vacuum ultra-violet radiation reaching the surface to be cleaned in the vacuum chamber is less than that found within the irradiation chamber.

2. The system of claim 1 wherein:
   the surface to be cleaned is a specimen stage arranged in the vacuum chamber; and
   a charged-particle beam source is in communication with the vacuum chamber to direct a charged-particle beam at the specimen stage.

3. The system of claim 1, wherein the ultraviolet radiation source is a mercury vapor resonance lamp with an output of about 185nm.

4. The system of claim 1, wherein the ultraviolet radiation source is a xenon excimer lamp.

5. A method of cleaning a vacuum chamber, the method comprising:
   flowing an oxygen-containing gas into a irradiation chamber to expose it to vacuum ultra violet (VUV) radiation having a wavelength less than about 193 nm;
   maintaining the oxygen-containing gas at a pressure below atmospheric that fully absorbs the VUV radiation to photo-disassociate the oxygen molecules into Oxygen radicals, but does not favor the formation of Ozone;
   differentially pumping the oxygen radical containing gas from the irradiation chamber into a separate vacuum chamber at a pressure lower than the irradiation chamber and below 100 milli Torr to prevent recombination of oxygen radicals, wherein the oxygen radicals oxidize hydrocarbon contaminants and clean a surface in the vacuum chamber of the hydrocarbon contaminants, wherein VUV radiation does not reach the surface; and
   evacuating the oxidized hydrocarbon contaminants from the vacuum chamber.

6. A method for cleaning and removing hydrocarbons from a region of a vacuum chamber comprising the steps of:
   activating a vacuum pump in fluid communication with the vacuum chamber;

flowing, using the vacuum pump, a gas mixture including a majority of molecular oxygen and molecular nitrogen gases into a separate irradiation chamber for photo disassociation of oxygen;

irradiating the flow of the gas mixture in the irradiation chamber with ultraviolet light of at least one wavelength selected to generate oxygen radicals, the ultraviolet light containing no wavelength that disassociates or ionizes nitrogen-containing molecules from the mixture, wherein exposure of the vacuum chamber to ultraviolet light is minimized;

maintaining the irradiation chamber at a pressure selected to promote complete absorption within the chamber of all of the ultraviolet light capable of generating oxygen radicals;

maintaining the vacuum chamber at a pressure lower than the irradiation chamber and below 100 milli Torr to minimize the recombination of the oxygen radicals and low enough to permit operation of a charged particle beam while removing hydrocarbons;

flowing the irradiated gas mixture through the region of the vacuum chamber to be cleaned to remove hydrocarbons oxidized by the oxygen radicals from the vacuum chamber without the presence of ultraviolet light; and exhausting the gas mixture with the oxidized hydrocarbons from the vacuum chamber using the vacuum pump.

7. The method of claim 6, further comprising the steps of:
evacuating the vacuum chamber of gas;
partially backfilling the chamber with gas; and
evacuating the chamber of gas before flowing the oxygen and nitrogen gas mixture through the vacuum chamber.

8. The method of claim 6 further comprising the steps of controlling and monitoring chamber pressure, gas flow rate, gas mixture, and UV light power according to a predetermined sequence.

9. The method of claim 6, where the vacuum chamber is part of an optical instrument wherein, carbon deposits upon the optical components of the optical instrument.

\* \* \* \* \*